United States Patent
Guo et al.

(10) Patent No.: US 10,522,725 B2
(45) Date of Patent: Dec. 31, 2019

(54) LED STRUCTURE AND LIGHT-EMITTING UNIT

(71) Applicant: LITE-ON OPTO TECHNOLOGY (CHANGZHOU) CO., LTD., Changzhou, Jiangsu (CN)

(72) Inventors: Ke-qin Guo, Shandong (CN); Wen Lee, Hubei (CN); Mu-qi Lee, Shanxi (CN); Shu-yong Jia, Jiangsu (CN)

(73) Assignee: LITE-ON OPTO TECHNOLOGY (CHANGZHOU) CO., LTD., Changzhou, Jiangsu Province (CN)

( * ) Notice: Subject to any disclaimer, the term of this patent is extended or adjusted under 35 U.S.C. 154(b) by 0 days.

(21) Appl. No.: 15/881,655

(22) Filed: Jan. 26, 2018

(65) Prior Publication Data
US 2019/0058096 A1    Feb. 21, 2019

(30) Foreign Application Priority Data
Aug. 17, 2017 (CN) .......................... 2017 1 0708831

(51) Int. Cl.
| | |
|---|---|
| *H01L 33/50* | (2010.01) |
| *H01L 33/58* | (2010.01) |
| *H01L 33/46* | (2010.01) |
| *G02B 5/28* | (2006.01) |
| *H01L 33/62* | (2010.01) |
| *H01L 33/44* | (2010.01) |
| *H01L 33/48* | (2010.01) |
| *H01L 33/54* | (2010.01) |

(52) U.S. Cl.
CPC .............. *H01L 33/58* (2013.01); *H01L 33/46* (2013.01); *H01L 33/501* (2013.01); *H01L 33/502* (2013.01); *G02B 5/285* (2013.01); *H01L 33/44* (2013.01); *H01L 33/486* (2013.01); *H01L 33/505* (2013.01); *H01L 33/54* (2013.01); *H01L 33/62* (2013.01)

(58) Field of Classification Search
CPC ..... H01L 33/00–648; H01L 33/50–508; F21Y 2115/10; F21V 1/00–26; F21V 3/00–12; F21V 5/00–10; F21V 7/00–30; F21V 9/00–45; F21V 11/00–186; F21V 13/00–14; F21V 14/00–085
See application file for complete search history.

(56) References Cited

U.S. PATENT DOCUMENTS

| | | | | |
|---|---|---|---|---|
| 5,813,752 | A * | 9/1998 | Singer ..................... | H01L 33/46 257/13 |
| 8,405,104 | B2 * | 3/2013 | Streubel .................. | H01L 33/50 257/80 |
| 9,506,626 | B2 * | 11/2016 | Hagemann .......... | C09K 11/7774 |

(Continued)

FOREIGN PATENT DOCUMENTS

| | | |
|---|---|---|
| CN | 1641413 A | 7/2005 |
| CN | 101047221 A | 10/2007 |
| CN | 101451673 B | 5/2012 |

*Primary Examiner* — Eric A. Ward
(74) *Attorney, Agent, or Firm* — Li & Cai Intellectual Property (USA) Office

(57) ABSTRACT

An LED structure includes a substrate, an LED chip disposed on the substrate, a wavelength conversion layer disposed above a light-emitting surface of the LED chip, and a cut-on optical filter disposed on a central region of the wavelength conversion layer.

20 Claims, 11 Drawing Sheets

(56) References Cited

U.S. PATENT DOCUMENTS

| | | | |
|---|---|---|---|
| 2005/0269582 A1* | 12/2005 | Mueller | C04B 35/44 257/94 |
| 2006/0208268 A1* | 9/2006 | Ueno | H01L 33/46 257/98 |
| 2010/0085758 A1* | 4/2010 | Takahashi | G02B 5/289 362/293 |
| 2011/0012147 A1* | 1/2011 | Bierhuizen | G03B 15/05 257/98 |
| 2011/0220953 A1* | 9/2011 | Bechtel | H01L 33/46 257/98 |
| 2011/0279998 A1* | 11/2011 | Su | H01L 33/46 362/84 |
| 2012/0098000 A1* | 4/2012 | Tsang | H01L 33/508 257/98 |
| 2013/0299865 A1* | 11/2013 | Bechtel | H01L 33/44 257/98 |
| 2015/0034990 A1* | 2/2015 | Roitman | H01L 33/46 257/98 |
| 2015/0137164 A1* | 5/2015 | Ichikawa | H01L 33/005 257/98 |
| 2016/0284931 A1* | 9/2016 | Tangring | H01L 33/02 |
| 2017/0098743 A1* | 4/2017 | Chen | H01L 33/507 |

\* cited by examiner

LED STRUCTURE AND LIGHT-EMITTING UNIT

BACKGROUND OF THE INVENTION

1. Field of the Invention

The present disclosure relates to a light-emitting unit; in particular, to an LED structure and a light-emitting unit for reducing a color temperature difference resulted from different light-emitting angles.

2. Description of Related Art

The conventional LED structure includes an LED chip and a wavelength conversion layer disposed on the LED chip. For different light-emitting angles of the LED chip, light passing through the wavelength conversion layer results in a yellow ring phenomenon. Specifically, when the LED chip emits blue light to travel through a periphery region of the wavelength conversion layer in a large incident angle, the blue light has a long traveling path in the wavelength conversion layer, such that there is a higher probability for the blue light to be converted to yellow light by the wavelength conversion layer and hence result in the yellow ring phenomenon.

SUMMARY OF THE INVENTION

The present disclosure provides an LED structure and a light-emitting unit to effectively improve the uniformity of color over angle (COA) drawbacks associated with conventional LED structures.

In summary, for the LED structure and the light-emitting unit in the present embodiment, the central region of the light-exiting surface of the wavelength conversion layer is provided with the cut-on optical filter having some specific limitations (i.e., the area of the projecting region defined is equal to 30%-90% of the area of the light-emitting surface, the cut-on wavelength of the cut-on optical filter is within a range of 450~480 nm at 50% of peak transmission, and the slope of the cut-on optical filter is within a range of 5~50 nm), so that the color temperature difference of the LED structure (or the light-emitting unit) can be reduced.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Figure 1:
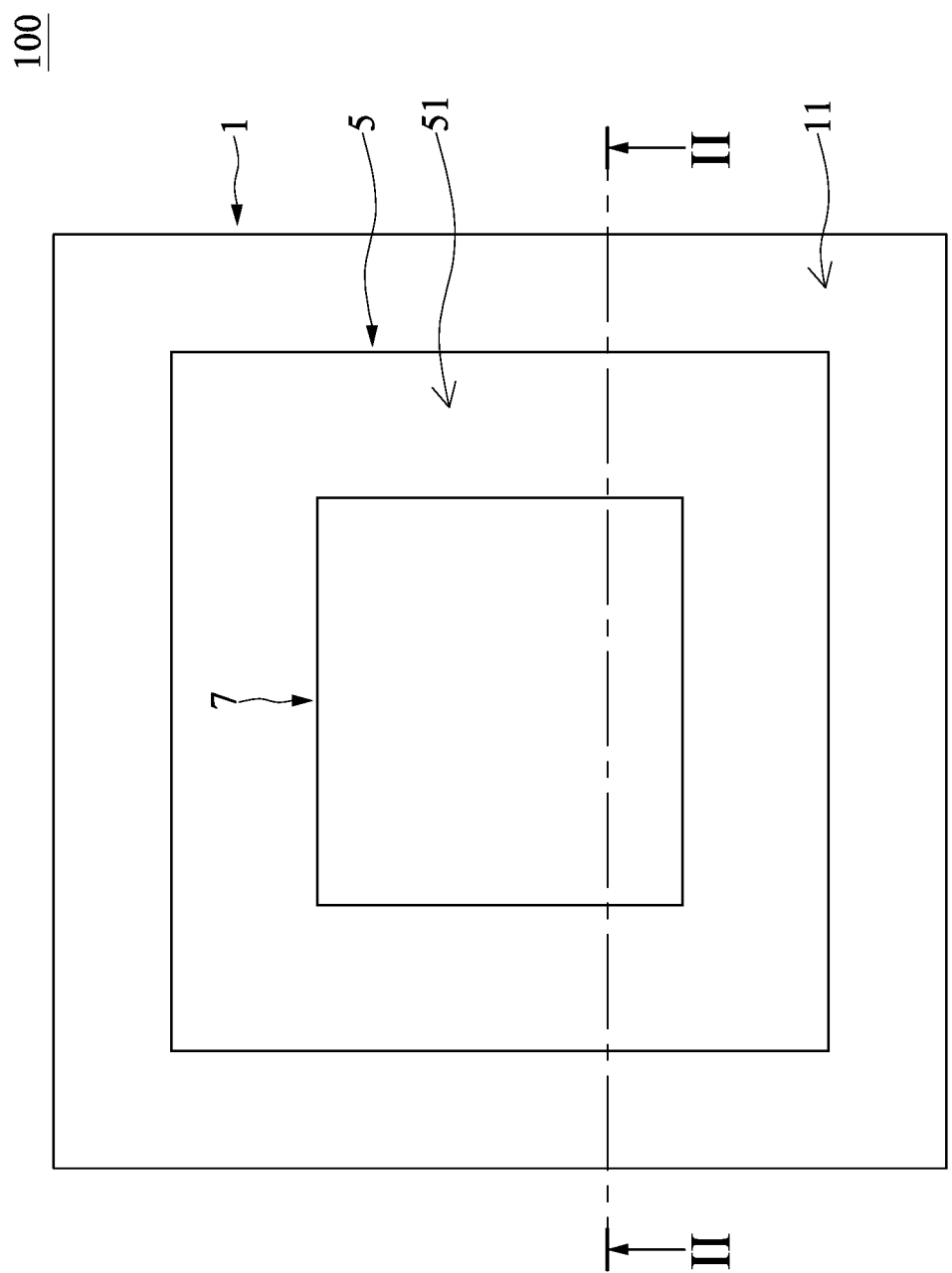
FIG. 1 is a top planar view showing an LED structure according to a first embodiment of the present disclosure.

Reference is made to FIGS. 1 to 11, which illustrate the present disclosure. References are hereunder made to the detailed descriptions and appended drawings in connection with the present disclosure. However, the appended drawings are merely provided for exemplary purposes, and should not be construed as restricting the scope of the present disclosure.

First Embodiment

Reference is first made to FIGS. 1 to 6, which illustrate a first embodiment of the present disclosure. The present embodiment discloses a light-emitting diode (LED) structure 100, which is formed to be an angle color uniformity LED (ACU LED). The LED structure 100 includes a substrate 1, an electrode layer 2 and a soldering layer 3 respectively disposed on two opposite surfaces of the substrate 1, an LED chip 4 disposed on the electrode layer 2, a wavelength conversion layer 5 disposed on the LED chip 4, a cut-on optical filter 6 disposed on the wavelength conversion layer 5, and a transparent layer 7 disposed on the cut-on optical filter 6.

It should be noted that the LED chip 4, the wavelength conversion layer 5, and the cut-on optical filter 6 in the present embodiment can be co-defined as a light-emitting unit 10. The field of application of the light-emitting unit 10 can be changed according to a designer's demand, that is to say, the light-emitting unit 10 is not limited to being applied with the LED structure 100.

Figure 2:
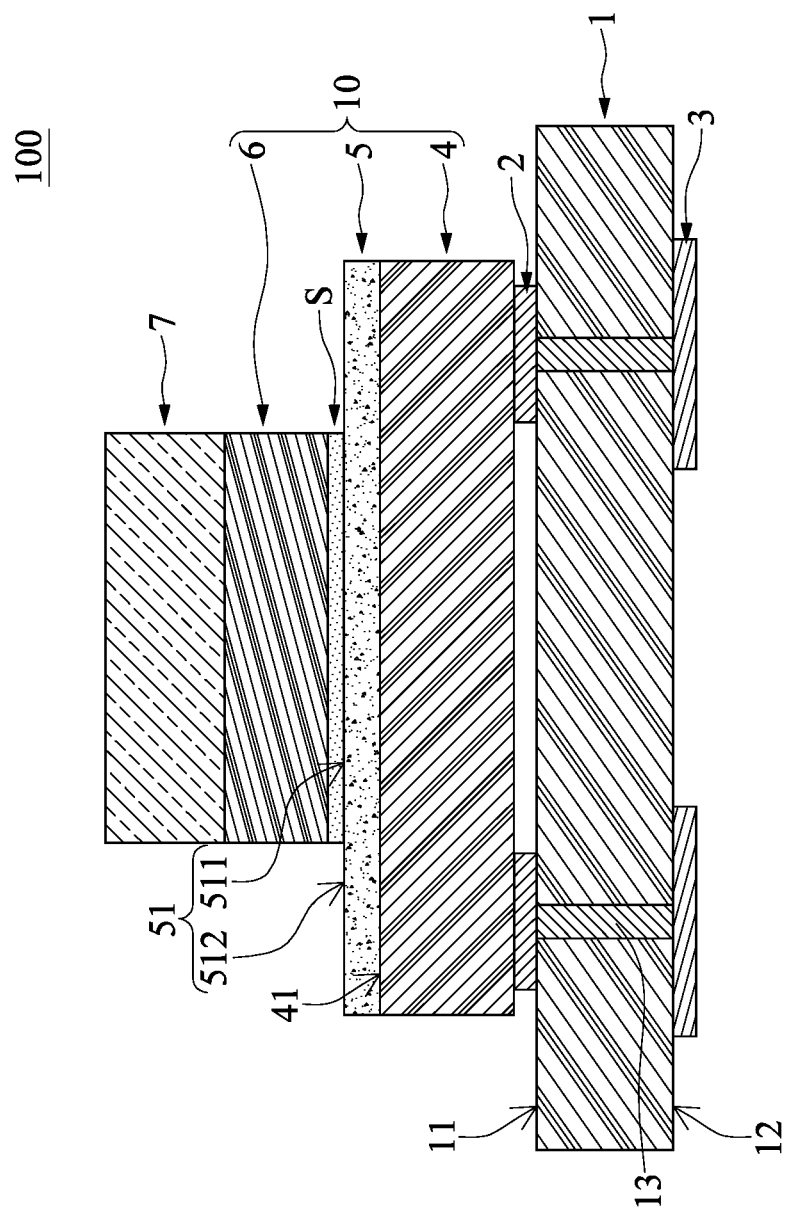
FIG. 2 is a cross-sectional view taken along a cross-sectional line II-II of FIG. 1.

As shown in FIGS. 1 and 2, the substrate 1 has a first surface 11 and a second surface 12 opposite to the first surface 11. The substrate 1 has a plurality of conductive pillars 13 embedded therein. Two opposite ends of each of the conductive pillars 13 are exposed from the first surface 11 and the second surface 12.

The electrode layer 2 is disposed on the first surface 11 of the substrate 1 and contacts one ends of the conductive pillars 13, and the soldering layer 3 is disposed on the second surface 12 of the substrate 1 and contacts the other ends of the conductive pillars 13, so that the electrode layer 2 and the soldering layer 3 are electrically connected to each other by the conductive pillars 13.

The LED chip 4 in the present embodiment is a flip chip, but the present disclosure is not limited thereto. The LED chip 4 is mounted on the electrode layer 2 and is electrically connected to the soldering layer 3 via the conductive pillars 13. Moreover, the LED chip 4 has a light-emitting surface 41 arranged away from the substrate 1.

The wavelength conversion layer 5 in the present embodiment is a phosphor sheet, but the present disclosure is not limited thereto. The phosphor sheet can be a phosphor in glass (PIG) sheet or a phosphor in ceramic (PIC) sheet, and the refractive index of the phosphor sheet is preferably within a range of 1.5~1.85. The wavelength conversion layer 5 is disposed on the light-emitting surface 41 of the LED chip 4, the light-emitting surface 41 of the LED chip 4 is preferably covered entirely by the wavelength conversion layer 5, and an outer edge of the wavelength conversion layer 5 is flush with that of the LED chip 4.

Specifically, the wavelength conversion layer 5 has a light-exiting surface 51 arranged away from the LED chip 4. That is to say, light emitted from the light-emitting surface 41 of the LED chip 4 can pass through the wavelength conversion layer 5 to travel out of the light-exiting surface 51. The light-exiting surface 51 includes a central region 511 and a periphery region 512 arranged around the central region 511. The periphery region 512 in the present embodiment is preferably in a ring shape, that is to say, the periphery region 512 is arranged between an outer edge of the light-exiting surface 51 and the central region 511. Moreover, the shape of the central region 511 can be adjusted according to a designer's demand (e.g., a circle, a square, a rectangular, or other shapes), and the present disclosure is not limited thereto.

In addition, in other embodiments of the present disclosure, the area of the light-exiting surface 51 of the wavelength conversion layer 5 can be 1~1.15 times of the area of the light-emitting surface 41 of the LED chip 4, and a geometric center of the LED chip 4 substantially overlapped with that of the wavelength conversion layer 5.

The cut-on optical filter 6 is disposed on the central region 511 of the light-exiting surface 51 of the wavelength conversion layer 5, and the cut-on optical filter 6 can be adhered to the central region 511 of the light-exiting surface 51 by using an adhering layer S (e.g., a silicone gel). Moreover, if the wavelength conversion layer 5 is made of a hard material, the cut-on optical filter 6 can be directly deposited on the central region 511 of the light-exiting surface 51, but the present disclosure is not limited thereto. The transparent layer 7 (i.e., a glass plate) is disposed on the cut-on optical filter 6, and an outer edge of the transparent layer 7 is preferably flush with that of the cut-on optical filter 6.

Figure 4:
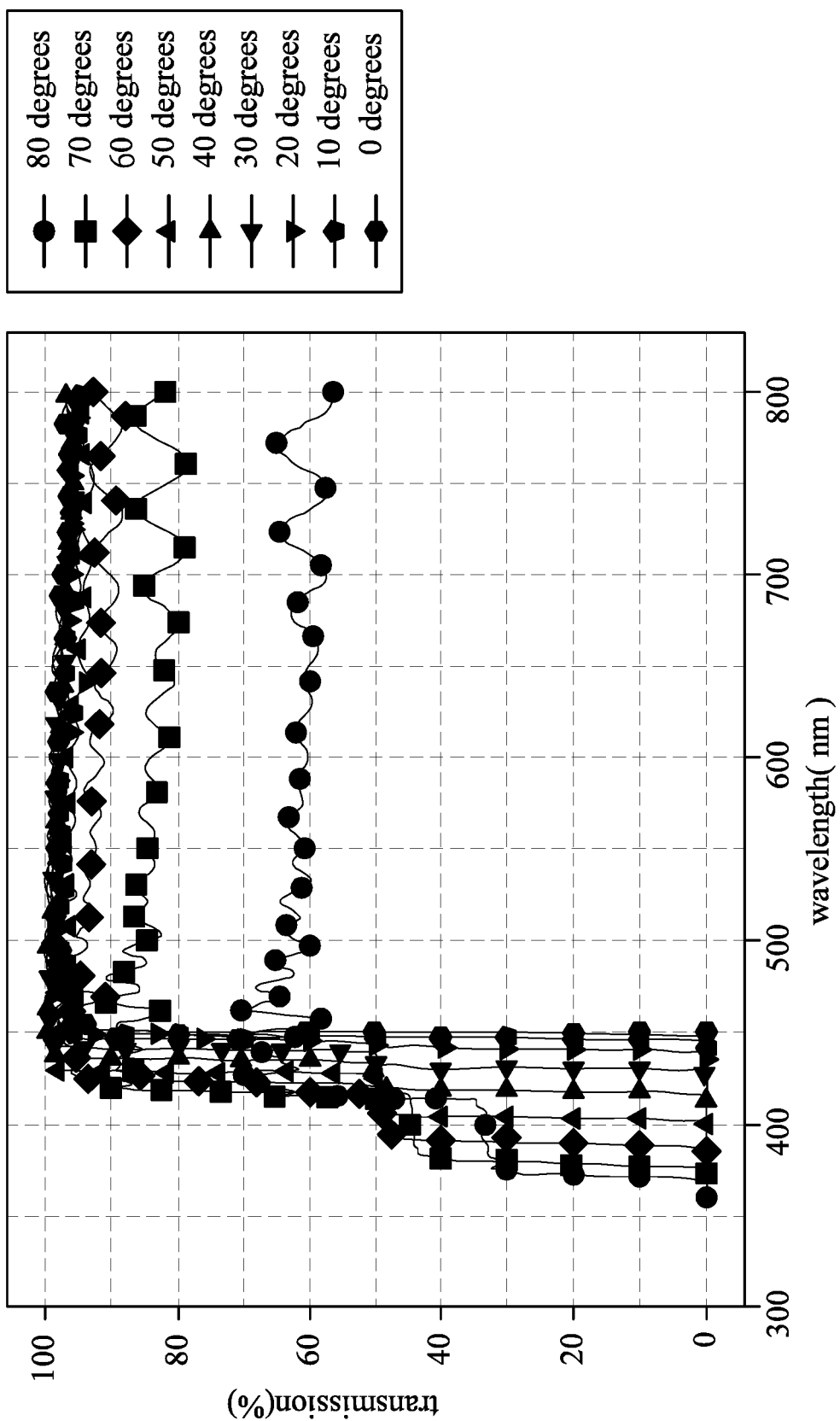
FIG. 4 is a diagram showing an optical property of a cut-on optical filter (Chroma AT450lp)
Figure 6:
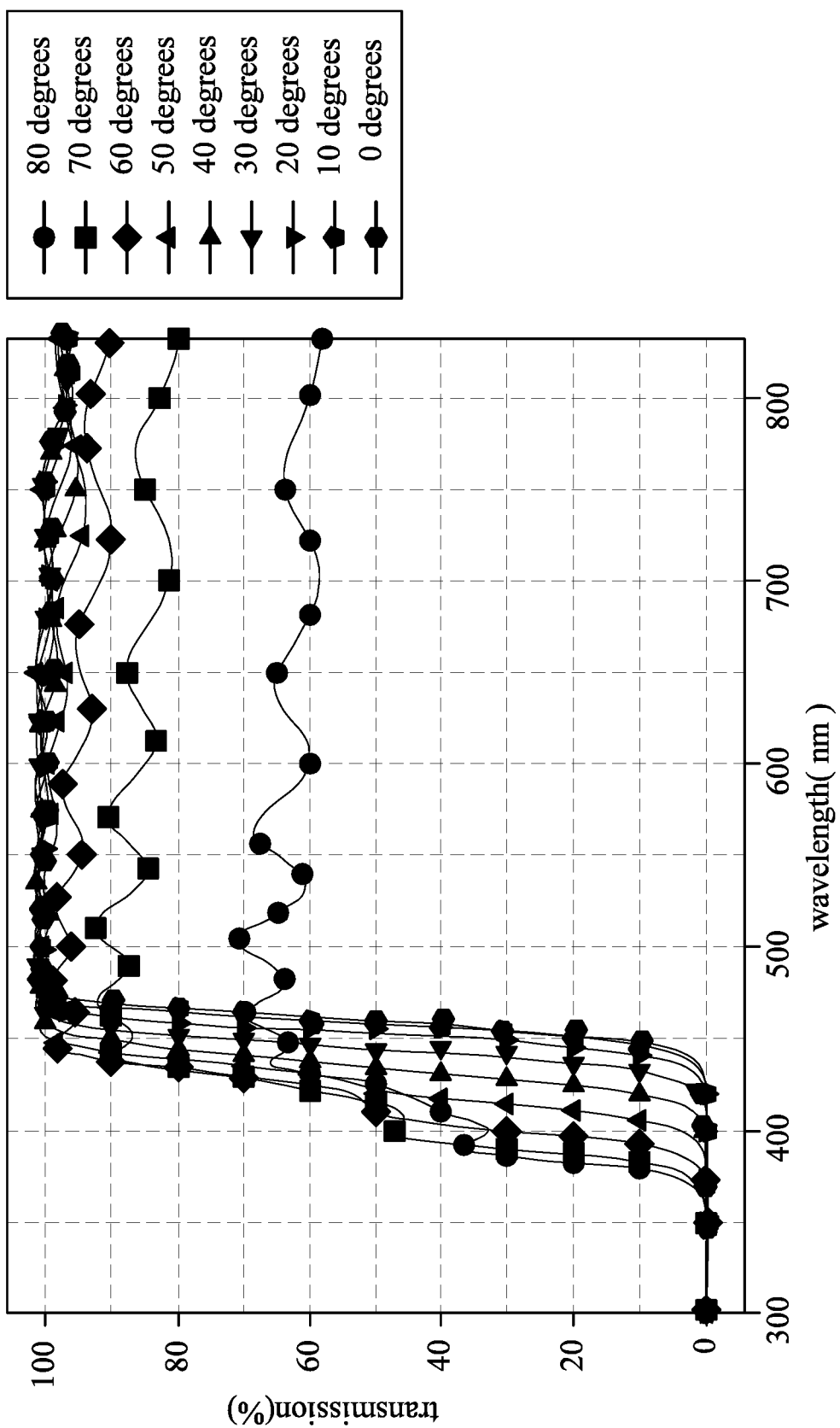
FIG. 6 is a diagram showing an optical property of a cut-on optical filter (Chroma CT460lp)

Moreover, the cut-on optical filter 6 in the present embodiment is configured to reflect at least part of blue light, which is emitted from the central region 511 of the light-exiting surface 51, into the wavelength conversion layer 5. Moreover, as shown in FIGS. 4 and 6, the cut-on optical filter 6 in different incident angles has different reflecting performances corresponding to lights of different wavelengths. Specifically, blue light in a small incident angle can be reflected by the cut-on optical filter 6, and visible light in a large incident angle can pass through the cut-on optical filter 6. In the present embodiment, the small incident angle is within a range of 0° to 30°, and 0° means light direction is parallel to the normal direction of the light-emitting surface 41 of the LED chip 4. Furthermore, the large incident angle is within a range of 30° to 90°, and 90° means light direction is perpendicular to the normal direction of the light-emitting surface 41 of the LED chip 4.

For a small incident angle, a low color temperature light emitted from the central region 511 and a high color temperature light emitted from the periphery region 512 are mixed in the cut-on optical filter 6 to form a mixed light, which has a color temperature lower than that of an LED chip provided without any cut-on optical filter, and the color temperature of the mixed light is substantially equal to that of light in a large incident angle (i.e., the LED structure 100 at a color temperature of 5500K and in a viewing angle of 120 degrees has a color temperature difference smaller than 300K), so that the uniformity of color temperature of the LED structure 100 can be achieved to avoid a yellow ring phenomenon. In the present embodiment, the cut-on optical filter 6 includes a plurality of high refractive index layers and a plurality of low refractive index layers respectively stacked on the high refractive index layers. In other words, the cut-on optical filter 6 includes a dielectric layer coating of alternating low reflective index materials and high reflective index materials. Specifically, in the present embodiment, a material having a reflective index larger than 1.8 means the high reflective index material, and light velocity in the high reflective index material is low. Moreover, a material having a reflective index less than 1.8 means the low reflective index material, and light velocity in the low reflective index material is high. Each of the high refractive index materials includes $Nb_2O_5$, $TiO_2$, or $Ta_2O_5$, and each of the low refractive index materials includes $SiO_2$, but the present disclosure is not limited thereto. Specifically, the refractive index of $Nb_2O_5$ is 2.3@500 nm, and the refractive index of $SiO_2$ is 1.4@500 nm.

In order to effectively reduce the color temperature difference of the LED structure 100 in the viewing angle, the cut-on optical filter 6 can be provided with the following limitations. Specifically, the cut-on optical filter 6 has a cut-on wavelength within a range of 450~480 nm at 50% of peak transmission thereof, and a slope of the cut-on optical filter 6 is within a range of 5~50 nm. Specifically, the slope of the cut-on optical filter 6 in the present embodiment is a wavelength subtraction between wavelength at the maximum transmission and that at the minimum transmission. Moreover, a projecting region defined by orthogonally projecting the cut-on optical filter 6 onto the light-emitting surface 41 of the LED chip 4 has an area equal to 30~90% of the area of the light-emitting surface 41, and the projecting region is preferably located at a center portion of the light-emitting surface 41.

It should be noted that the outer edge of the wavelength conversion layer 5 is flush with that of the LED chip 4. Moreover, the area ratio between the projecting region and the light-emitting surface 41 in the present embodiment can be regarded as the area ratio between the light-exiting surface 51 and the light-emitting surface 41, and the area ratio is 30~90%.

Specifically, the LED structure 100 in the present embodiment can be provided with different cut-on optical filters 6 (i.e., Chroma AT450lp or Chroma CT460lp), and a simulation test of the LED structure 100 is implemented by using the different cut-on optical filters 6 in a plurality of different sizes, thereby confirming that the color temperature difference of the LED structure 100 in the viewing angle can be reduced. Moreover, FIGS. 4 and 6 respectively show the optical properties of the different cut-on optical filters 6 (i.e., Chroma AT450lp or Chroma CT460lp) in the present embodiment.

Figure 3:
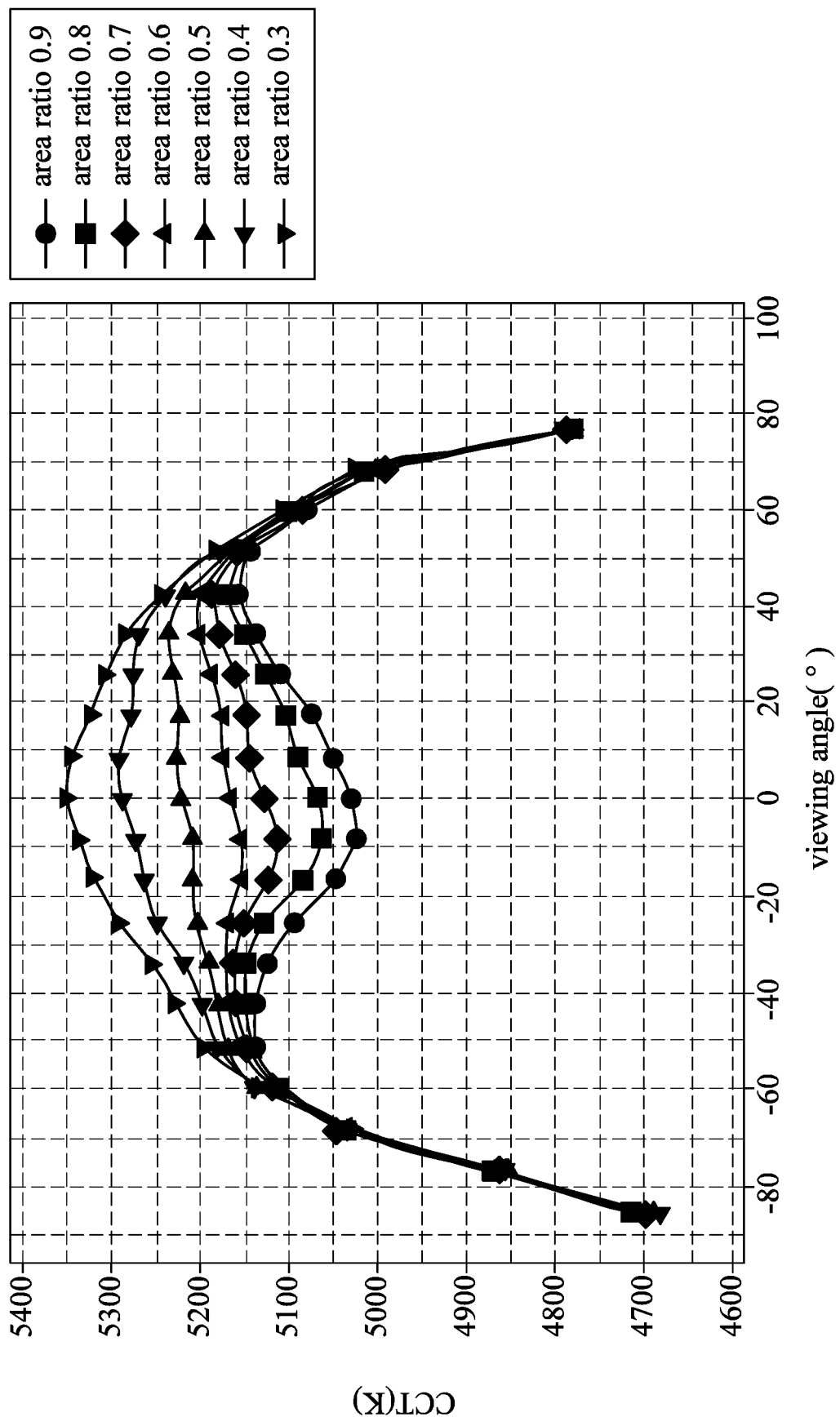
FIG. 3 is a first simulation diagram of the LED structure of FIG. 1.

Reference is made to FIG. 3, which illustrates a first simulation diagram of the LED structure 100. The cut-on wavelength of the cut-on optical filter 6 (Chroma AT450lp) at 50% of the peak transmission thereof is 450 nm, and the slope of the cut-on optical filter 6 is 7 nm (as shown in FIG. 4). The curves of FIG. 3 correspond to the area ratio between the projecting region and the light-emitting surface 41, and the curves in FIG. 3 counted from lower to upper respectively correspond to the area ratios of 30%, 40%, 50%, 60%, 70%, 80%, and 90%. Moreover, for the LED structure 100, the correlated color temperature (CCT) or the color temperature difference in a viewing angle from −60° to 60° can be obtained from FIG. 3 and is approximately aggregated to form the following chart. Accordingly, when the area of the projecting region is equal to 60% of the area of the light-emitting surface 41, the LED structure 100 has a smaller color temperature difference in the viewing angle, but the present disclosure is not limited thereto. For example, the area of the projecting region in the present embodiment can be equal to 50%~70% of the area of the light-emitting surface.

| | Area ratio | | | |
|---|---|---|---|---|
| | 90% | 80% | 70% | 60% |
| Color temperature difference in viewing angle from −60° to 60° | 134 K | 109 K | 105 K | 101 K |

| | Area ratio | | | |
|---|---|---|---|---|
| | 50% | 40% | 30% | 0 |
| -Color temperature difference in viewing angle from −60° to 60° | 151 K | 194 K | 239 K | 370 K |

Figure 5:
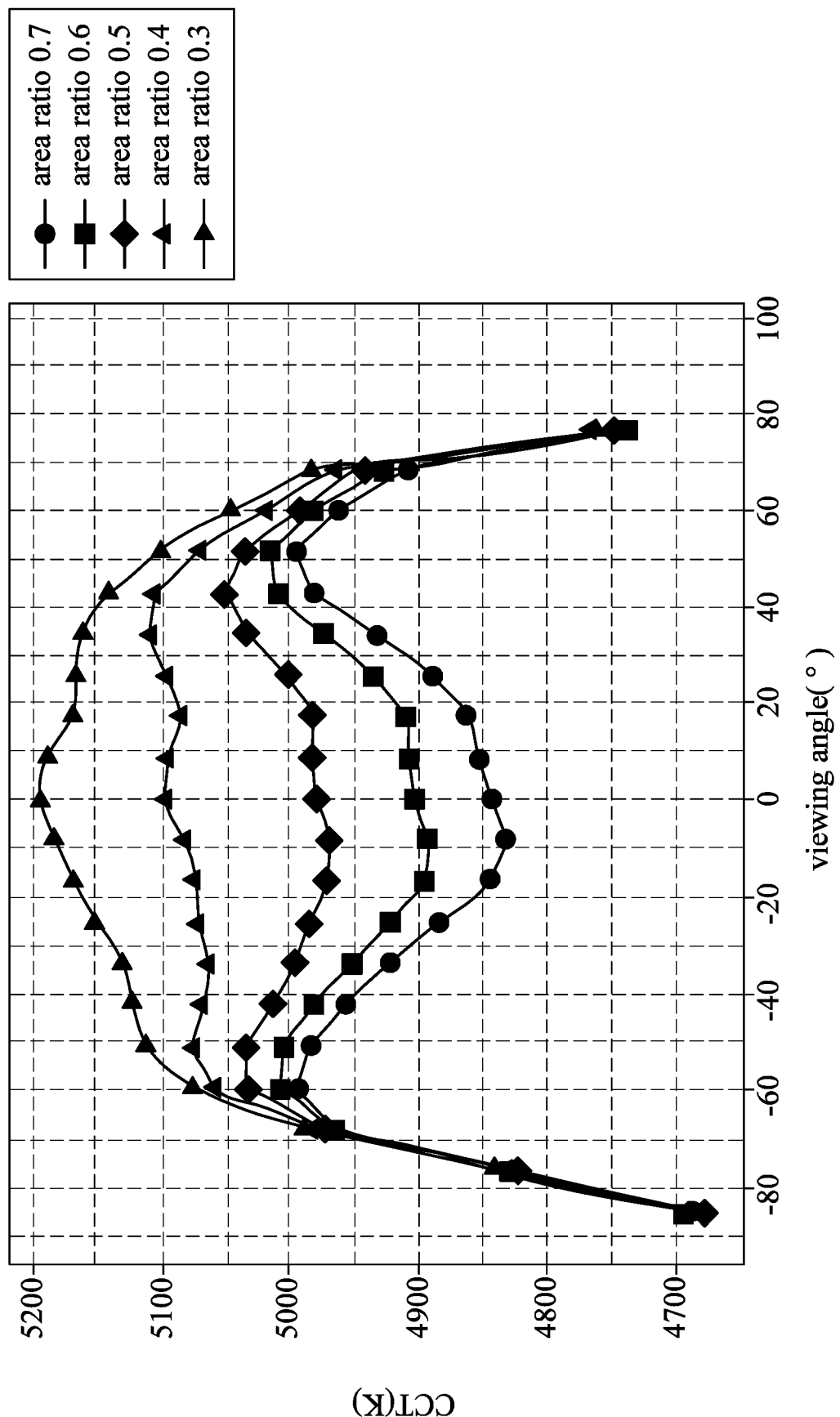
FIG. 5 is a second simulation diagram of the LED structure of FIG. 1.

Reference is made to FIG. 5, which illustrates a second simulation diagram of the LED structure 100. The cut-on wavelength of the cut-on optical filter 6 (Chroma CT460lp) at 50% of the peak transmission thereof is 460 nm, and the slope of the cut-on optical filter 6 is 34 nm (as shown in FIG. 6). The curves of FIG. 5 correspond to the area ratio between the projecting region and the light-emitting surface 41, and the curves in FIG. 5 counted from lower to upper respectively correspond to the area ratios of 30%, 40%, 50%, 60%, and 70%. Moreover, for the LED structure 100, the correlated color temperature or the color temperature difference in the viewing angle from −60° to 60° can be obtained from FIG. 5. Accordingly, when the area of the projecting region is equal to 50% of the area of the light-emitting surface 41, the LED structure 100 has a smaller color temperature difference in the viewing angle, but the present disclosure is not limited thereto. For example, the area of the projecting region in the present embodiment can be equal to 40%-60% of the area of the light-emitting surface.

Second Embodiment

Figure 7:
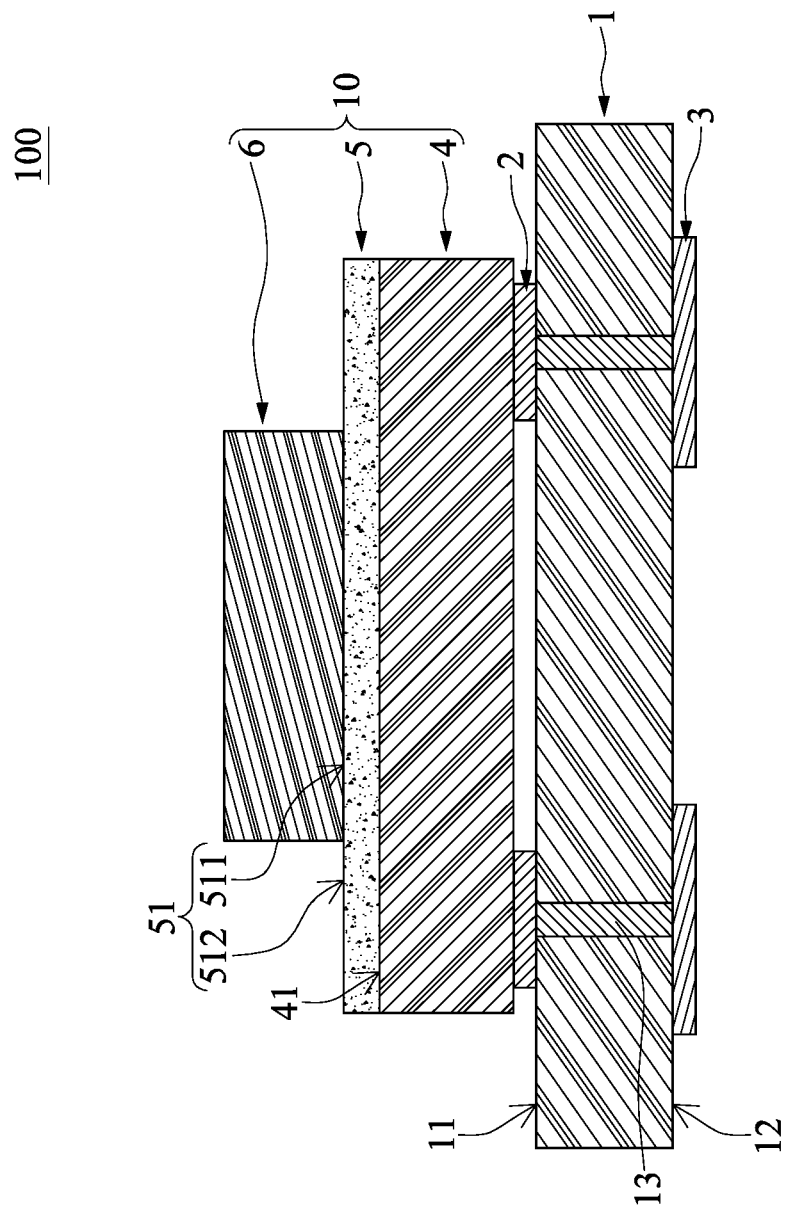
FIG. 7 is a cross-sectional view showing the LED structure according to a second embodiment of the present disclosure.

Reference is made to FIG. 7, which illustrates a second embodiment of the present disclosure. The second embodiment is similar to the first embodiment, and the difference between the two embodiments is that the LED structure 100 in the present embodiment is provided without the transparent layer 7.

Third Embodiment

Figure 8:
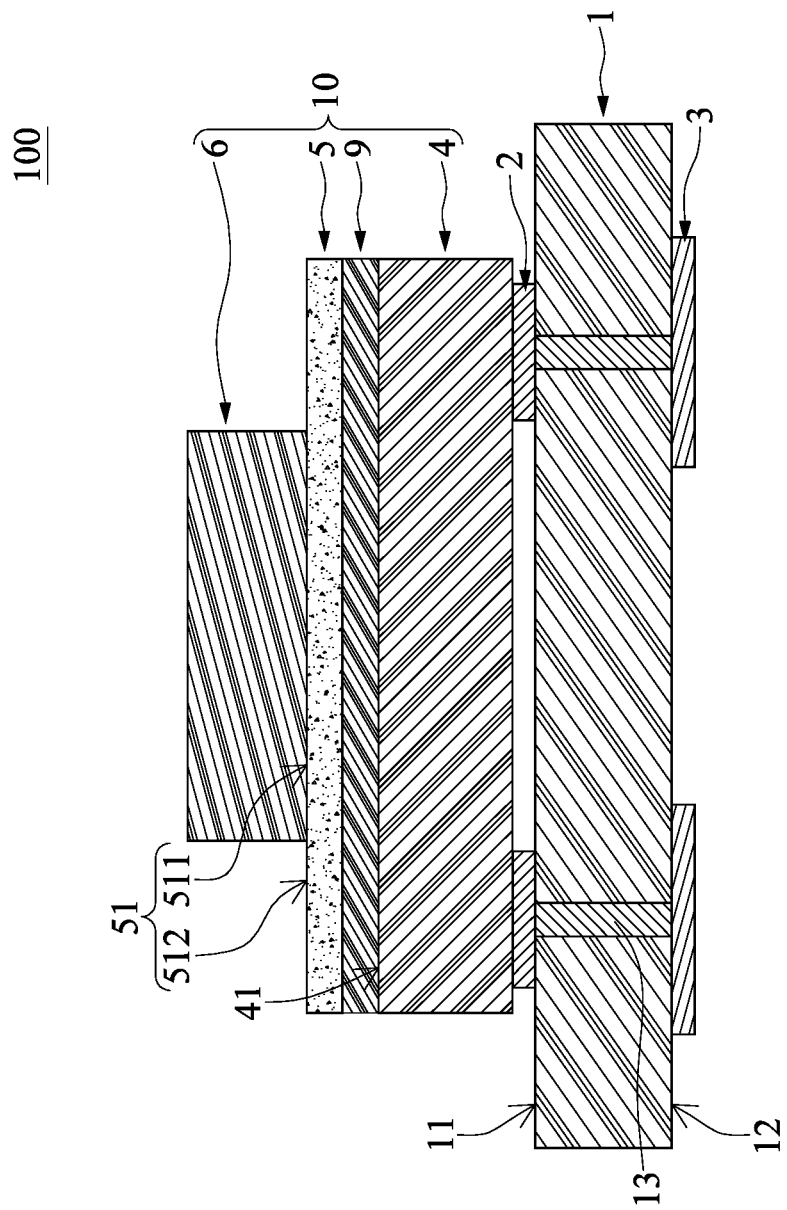
FIG. 8 is a cross-sectional view showing the LED structure according to a third embodiment of the present disclosure.
Figure 9:
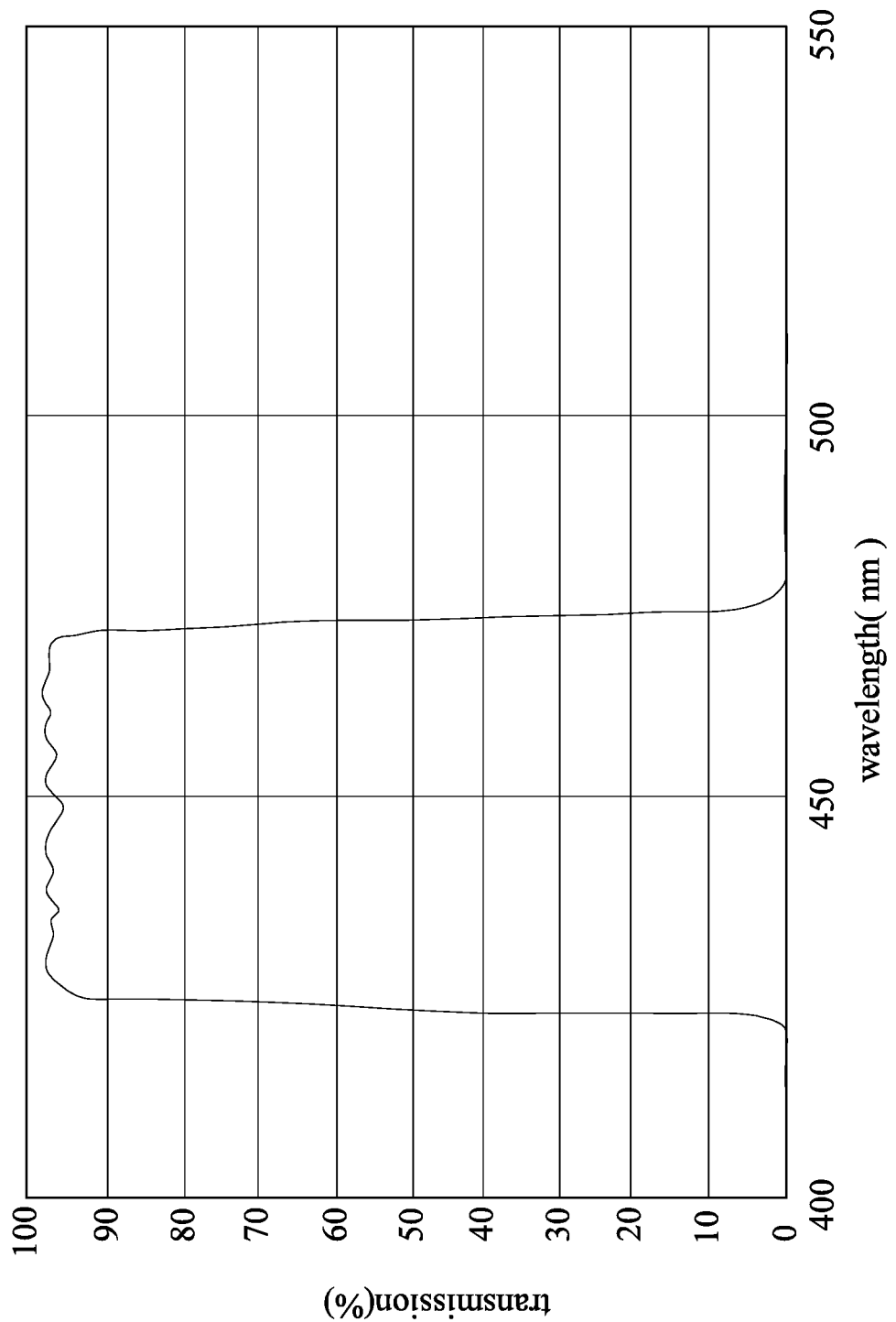
FIG. 9 is a diagram showing an optical property of a band pass filter of FIG. 8.

Reference is made to FIGS. 8 and 9, which illustrate a third embodiment of the present disclosure. The third embodiment is similar to the second embodiment, and the difference between the two embodiments is that the LED structure 100 in the present embodiment further includes a band pass filter 9. The LED chip 4, the wavelength conversion layer 5, the cut-on optical filter 6, and the band pass filter 9 in the present embodiment can be co-defined as a light-emitting unit 10.

Specifically, the band pass filter 9 is disposed on the light-emitting surface 41 of the LED chip 4, and the wavelength conversion layer 5 is disposed on the band pass filter 9. The outer edges of the LED chip 4, the wavelength conversion layer 5, and the band pass filter 9 are flush with each other. That is to say, the wavelength conversion layer 5 is disposed above the light-emitting surface 41 of the LED chip 4.

As shown in FIG. 9, the band pass filter 9 in the embodiment provides for a specific light to pass therethrough, in which the specific light has a wavelength within a range of 445~455 nm. Moreover, the band pass range of the band pass filter 9 is 20~50 nm, and the slope of the band pass filter 9 is within a range of 5~15 nm. Specifically, the slope of the band pass filter 9 in the present embodiment is a wavelength subtraction between wavelength at the maximum transmission and that at the minimum transmission. In other words, the band pass filter 9 in the embodiment only provides for blue light to pass therethrough and reflects other colored lights, but the present disclosure is not limited thereto.

Fourth Embodiment

Figure 10:
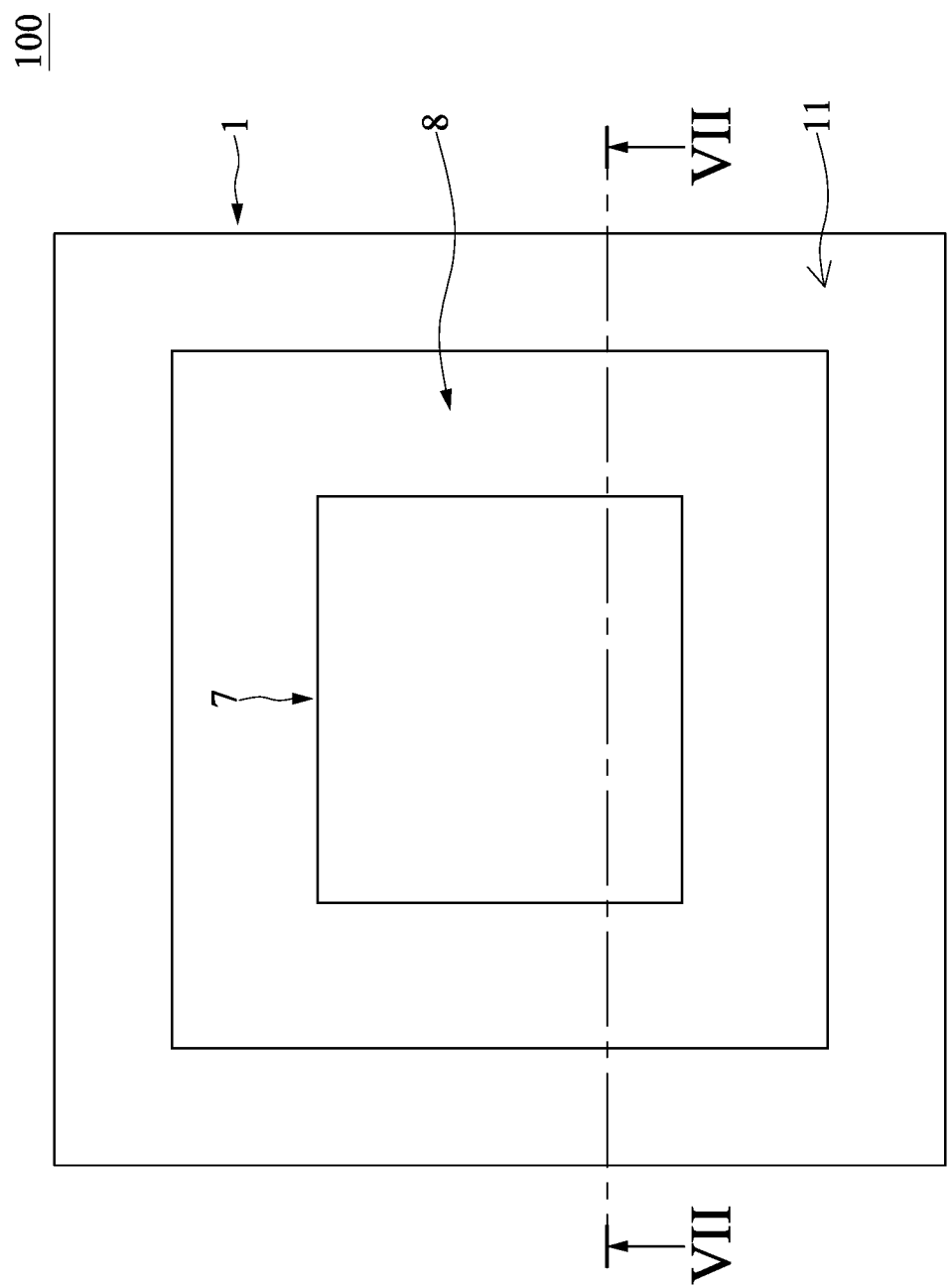
FIG. 10 is a cross-sectional view showing the LED structure according to a fourth embodiment of the present disclosure.
Figure 11:
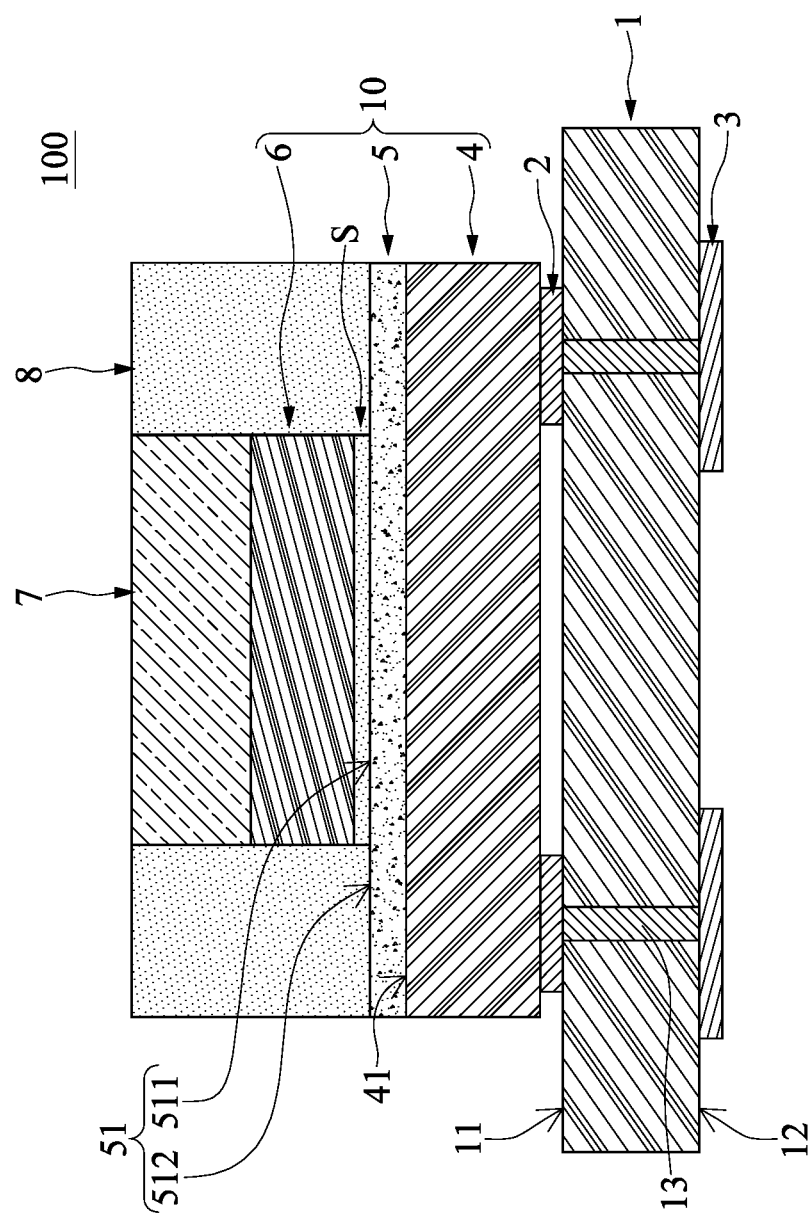
FIG. 11 is a cross-sectional view taken along a cross-sectional line XI-XI of FIG. 10.

Reference is made to FIGS. 10 and 11, which illustrate a fourth embodiment of the present disclosure. The fourth embodiment is similar to the first embodiment, and the difference between the two embodiments is that the LED structure 100 in the present embodiment further includes a silicone layer 8.

Specifically, the silicone layer 8 is disposed on the periphery region 512 of the light-exiting surface 51 of the wavelength conversion layer 5, and the silicone layer 8 covers the outer edges of the transparent layer 7 and the cut-on optical filter 6. An outer edge of the silicone layer 8 is preferably flush with the outer edges of the LED chip 4 and the wavelength conversion layer 5, and a top surface of the silicone layer 8 is flush with that of the transparent layer 7.

The Effects of the Above Embodiments

In summary, in the LED structure and the light-emitting unit of the present disclosure, the central region of the light-exiting surface of the wavelength conversion layer is provided with the cut-on optical filter having some specific limitations (i.e., the area of projecting region defined is equal to 30%~90% of the area of the light-emitting surface, the cut-on wavelength of the cut-on optical filter is within a range of 450~480 nm at 50% of peak transmission, and the slope of the cut-on optical filter is within a range of 5~50 nm), so that the color temperature difference of the LED structure (or the light-emitting unit) can be reduced.

Moreover, when the cut-on wavelength of the cut-on optical filter at 50% of the peak transmission thereof is 450 nm and the slope of the cut-on optical filter is 7 nm, the size of the cut-on optical filter can be formed according to the area ratio between the projecting region and the light-emitting surface, which is within the range of 50%~70%, so that the color temperature difference of the LED structure in the viewing angle can be smaller.

In addition, when the cut-on wavelength of the cut-on optical filter at 50% of the peak transmission thereof is 460 nm and the slope of the cut-on optical filter is 34 nm, the size of the cut-on optical filter can be formed according to the above area ratio between the projecting region and the light-emitting surface, which is within the range of 40%~60%, so that the color temperature difference of the LED structure in the viewing angle can be smaller.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A light-emitting diode (LED) structure, comprising:
   a substrate having a first surface and a second surface opposite to the first surface;
   an electrode layer disposed on the first surface of the substrate;
   an LED chip having a light-emitting surface and disposed on the electrode layer;
   a wavelength conversion layer disposed above the light-emitting surface of the LED chip and having a light-exiting surface arranged away from the LED chip, wherein the light-exiting surface includes a central region and a periphery region arranged around the central region; and
   a cut-on optical filter disposed on the central region of the light-exiting surface, wherein the cut-on optical filter does not cover entirely a top surface of the light-exiting surface, and wherein a projecting region defined by orthogonally projecting the cut-on optical filter onto the light-emitting surface has an area equal to 30~90% of an area of the light-emitting surface,
   wherein the cut-on optical filter has a cut-on wavelength within a range of 450~480 nm at 50% of peak transmission thereof, and a slope of the cut-on optical filter is within a range of 5~50 nm.

2. The LED structure as claimed in claim 1, further comprising a silicone layer disposed on the periphery region, wherein the silicone layer covers the outer edges of the cut-on optical filter, and a top surface of the silicone layer is flush with that of the cut-on optical filter.

3. The LED structure as claimed in claim 1, further comprising a transparent layer disposed on the cut-on optical filter, wherein an outer edge of the transparent layer is flush with that of the cut-on optical filter.

4. The LED structure as claimed in claim 3, further comprising a silicone layer disposed on the periphery region, wherein the silicone layer covers the outer edges of the transparent layer and the cut-on optical filter, and a top surface of the silicone layer is flush with that of the transparent layer.

5. The LED structure as claimed in claim 1, further comprising a band pass filter disposed between the LED chip and the wavelength conversion layer.

6. The LED structure as claimed in claim 5, further comprising a transparent layer disposed on the cut-on optical filter, wherein an outer edge of the transparent layer is flush with that of the cut-on optical filter.

7. The LED structure as claimed in claim 6, further comprising a silicone layer disposed on the periphery region, wherein the silicone layer covers the outer edges of the transparent layer and the cut-on optical filter, and a top surface of the silicone layer is flush with that of the transparent layer.

8. The LED structure as claimed in claim 5, further comprising a silicone layer disposed on the periphery region, wherein the silicone layer covers the outer edges of the cut-on optical filter, and a top surface of the silicone layer is flush with that of the cut-on optical filter.

9. The LED structure as claimed in claim 1, wherein at least part of blue light in a small incident angle is reflected by the cut-on optical filter, and visible light in a large incident angle passes through the cut-on optical filter.

10. The LED structure as claimed in claim 9, wherein the cut-on optical filter includes a dielectric layer coating of alternating low reflective index materials and high reflective index materials.

11. The LED structure as claimed in claim 10, wherein each of the high refractive index materials includes $Nb_2O_5$, $TiO_2$, or $Ta_2O_5$, and each of the low refractive index materials includes $SiO_2$.

12. The LED structure as claimed in claim 1, wherein the projecting region is located at a center portion of the light-emitting surface, and the LED structure at a color temperature of 5500K and in a viewing angle of 120 degrees has a color temperature difference smaller than 300K.

13. The LED structure as claimed in claim 1, wherein the wavelength conversion layer is a phosphor in glass (PIG) sheet or a phosphor in ceramic (PIC) sheet, and the refractive index of the wavelength conversion layer is within a range of 1.5~1.85.

14. A light-emitting unit, comprising:
    an LED chip having a light-emitting surface;
    a wavelength conversion layer disposed above the light-emitting surface of the LED chip and having a light-exiting surface arranged away from the LED chip, wherein the light-exiting surface includes a central region and a periphery region arranged around the central region; and
    a cut-on optical filter disposed on the central region of the light-exiting surface, wherein the cut-on optical filter does not cover entirely a top surface of the light-exiting surface, and the periphery region of the wavelength conversion layer and lateral sides of the cut-on optical filter jointly define at least one notch arranged above the LED chip, and wherein a projecting region defined by orthogonally projecting the cut-on optical filter onto the light-emitting surface has an area equal to 30~90% of an area of the light-emitting surface,
    wherein the cut-on optical filter has a cut-on wavelength within a range of 450~480 nm at 50% of peak transmission thereof, and a slope of the cut-on optical filter is within a range of 5~50 nm.

15. The LED structure as claimed in claim 14, further comprising a transparent layer disposed on the cut-on optical filter, wherein an outer edge of the transparent layer is flush with that of the cut-on optical filter.

16. The LED structure as claimed in claim 15, wherein at least part of blue light in a small incident angle is reflected by the cut-on optical filter, and visible light in a large incident angle passes through the cut-on optical filter.

17. The LED structure as claimed in claim 16, wherein the cut-on optical filter includes a dielectric layer coating of alternating low reflective index materials and high reflective index materials.

18. The LED structure as claimed in claim 14, wherein further comprising a band pass filter disposed between the LED chip and the wavelength conversion layer.

19. The LED structure as claimed in claim 18, wherein a band pass range of the band pass filter is 20~50 nm, a slope of the band pass filter is within a range of 5~15 nm, and the band pass filter is configured for blue light to pass therethrough and reflects colored lights other than the blue light.

20. The LED structure as claimed in claim 18, further comprising a transparent layer disposed on the cut-on optical filter, wherein an outer edge of the transparent layer is flush with that of the cut-on optical filter.

* * * * *